US012190767B2

(12) United States Patent
Feng et al.

(10) Patent No.: US 12,190,767 B2
(45) Date of Patent: Jan. 7, 2025

(54) TILING DEVICE INCLUDING SUBSTRATES AND DATA DRIVING CIRCUIT

(71) Applicant: Innolux Corporation, Miaoli County (TW)

(72) Inventors: Yu-Hsin Feng, Miaoli County (TW); Yu-Tse Lu, Miaoli County (TW); Chong-De Wang, Miaoli County (TW)

(73) Assignee: Innolux Corporation, Miaoli County (TW)

( * ) Notice: Subject to any disclaimer, the term of this patent is extended or adjusted under 35 U.S.C. 154(b) by 17 days.

(21) Appl. No.: 17/985,926

(22) Filed: Nov. 14, 2022

(65) Prior Publication Data

US 2023/0186812 A1    Jun. 15, 2023

Related U.S. Application Data

(60) Provisional application No. 63/289,644, filed on Dec. 15, 2021.

(30) Foreign Application Priority Data

Aug. 30, 2022    (CN) .......................... 202211049914.8

(51) Int. Cl.
*G09G 3/20*    (2006.01)
*H01L 23/50*   (2006.01)

(52) U.S. Cl.
CPC ............. *G09G 3/20* (2013.01); *G09G 3/2096* (2013.01); *H01L 23/50* (2013.01); *G09G 2300/0828* (2013.01); *G09G 2310/0267* (2013.01); *G09G 2310/0275* (2013.01); *G09G 2320/0673* (2013.01); *G09G 2360/122* (2013.01)

(58) Field of Classification Search
CPC ................... G09G 3/20; G09G 3/2096; G09G 2300/0828; H01L 23/50
See application file for complete search history.

(56) References Cited

U.S. PATENT DOCUMENTS

2005/0128170 A1* 6/2005 Kang ........................ G09G 3/20
345/87
2015/0221274 A1* 8/2015 Ishii ...................... G09G 3/3685
345/100

(Continued)

FOREIGN PATENT DOCUMENTS

| CN | 105096874 | 11/2015 |
| CN | 113219729 | 8/2021 |

OTHER PUBLICATIONS

"Office Action of Taiwan Counterpart Application", issued on Mar. 10, 2023, pp. 1-12.

*Primary Examiner* — Sejoon Ahn
(74) *Attorney, Agent, or Firm* — JCIPRNET

(57) ABSTRACT

A tiling device with a driving method having a low number of data pins is provided. The tiling device includes a first substrate, a second substrate and a data driving circuit. The first substrate includes a plurality of first semiconductor units. The second substrate includes a plurality of second semiconductor units. The data driving circuit simultaneously provides first data signals to the plurality of first semiconductor units and the plurality of second semiconductor units, and simultaneously provides second data signals to the plurality of first semiconductor units and the plurality of second semiconductor units.

19 Claims, 7 Drawing Sheets

(56) References Cited

U.S. PATENT DOCUMENTS

| | | | |
|---|---|---|---|
| 2018/0122295 A1* | 5/2018 | Kim | G09G 3/20 |
| 2018/0364514 A1* | 12/2018 | Liu | G09G 3/20 |
| 2018/0366047 A1* | 12/2018 | Sang | G06F 3/0412 |
| 2018/0366068 A1* | 12/2018 | Liu | G06V 40/171 |
| 2019/0147800 A1* | 5/2019 | Bae | G06F 3/0416 |
| | | | 345/173 |
| 2021/0082329 A1* | 3/2021 | Chen | G09G 3/3677 |
| 2022/0114936 A1* | 4/2022 | Lee | G09G 3/20 |

* cited by examiner

TILING DEVICE INCLUDING SUBSTRATES AND DATA DRIVING CIRCUIT

CROSS-REFERENCE TO RELATED APPLICATION

This application claims the priority benefit of U.S. provisional application Ser. No. 63/289,644, filed on Dec. 15, 2021 and China application serial no. 202211049914.8, filed on Aug. 30, 2022. The entirety of each of the above-mentioned patent applications is hereby incorporated by reference herein and made a part of this specification.

BACKGROUND

Technical Field

The disclosure relates to an electronic device, and particularly, to a tiling device with a display function.

Description of Related Art

An electronic device with a display function includes a data driving circuit and a plurality of pixels. The data driving circuit provides the pixels with data signals through data pins. In response to the demand for high display resolution, the quantity of the pixels per unit area increases. Therefore, the data driving circuit needs to increase the quantity of data pins. When there is a limited layout area of the data driving circuit, as the number of data pins increases, the widths of the data pins may be reduced.

It should be noted that in a manufacturing process, the minimum width of the data pin is limited. Once the width of the data pin is less than the limited minimum width, a yield of a tiling device is bound to decrease. To meet the requirement of high display resolution, a current practice is to increase the quantity of the data driving circuits or the layout area of the circuits. As a result, with such a method, the manufacturing cost of the tiling device is increased. Therefore, how to provide an electronic device with a driving method having a low number of data pins is one of the research focuses for those skilled in the art.

SUMMARY

The disclosure is directed to a tiling device with a driving method having a low number of data pins.

According to an embodiment of the invention, the tiling device includes a first substrate, a second substrate and a data driving circuit. The first substrate includes a plurality of first semiconductor units. The second substrate includes a plurality of second semiconductor units. The data driving circuit is coupled to the first substrate and the second substrate. The data driving circuit simultaneously provides first data signals to the plurality of first semiconductor units and the plurality of second semiconductor units, and simultaneously provides second data signals to the plurality of first semiconductor units and the plurality of second semiconductor units.

Based on the above description, the data driving circuit simultaneously provides the first data signals to the plurality of first semiconductor units and the plurality of second semiconductor units, and simultaneously provides the second data signals to the plurality of first semiconductor units and the plurality of second semiconductor units. Therefore, the number of data pins of the data driving circuit may be equal to a number of data channels of one of the first substrate and the second substrate, not equal to a sum of the number of data channels of the first substrate and the number of data channels of the second substrate. In this way, the number of data pins of the data driving circuit is reduced.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DESCRIPTION OF THE EMBODIMENTS

Figure 1:
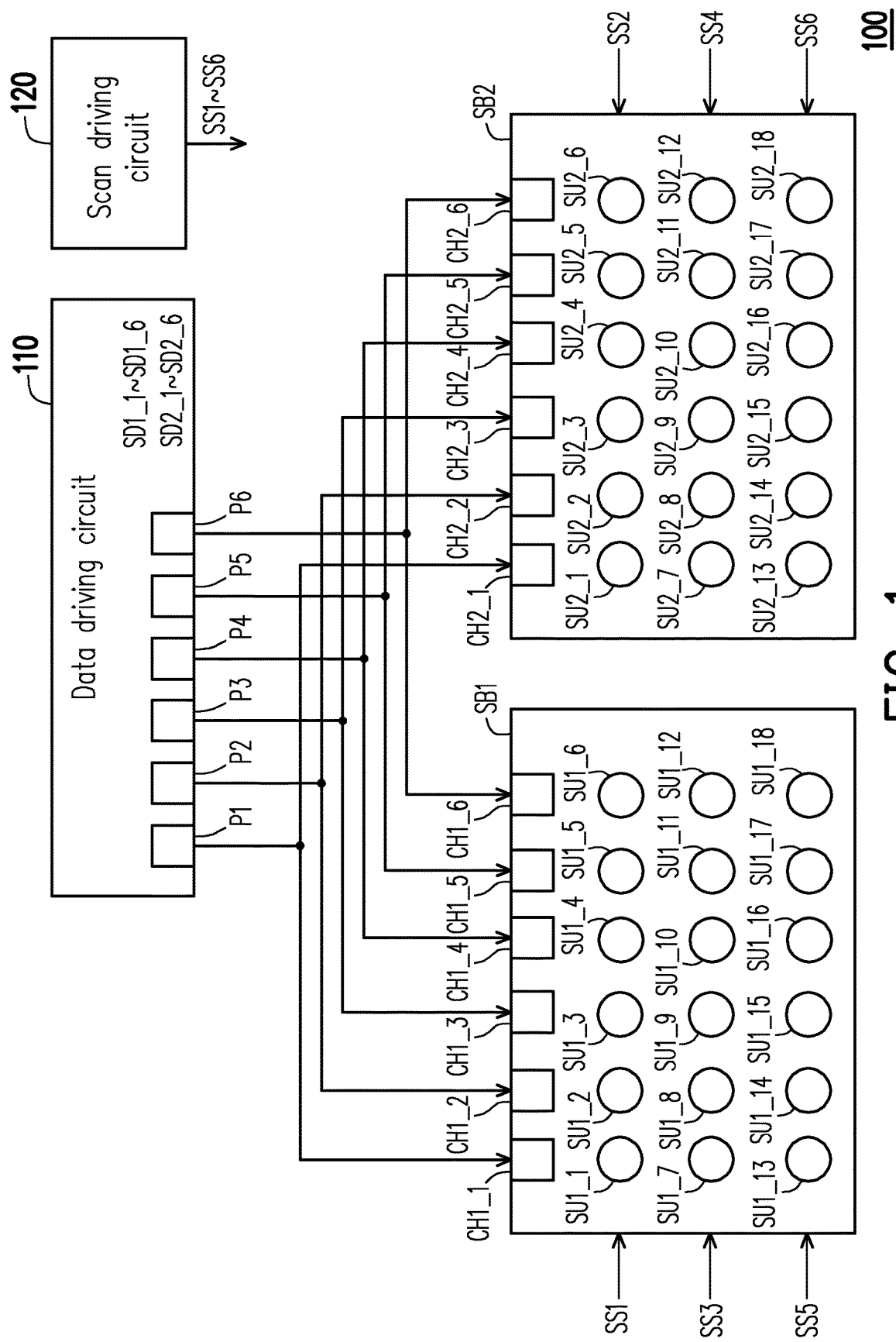
FIG. 1 is a schematic diagram of a tiling device according to a first embodiment of the disclosure.

The disclosure may be understood by referring to the following detailed description taken in conjunction with the drawings as described below. It should be noted that, for the purpose of clarity and ease of understanding for the reader, the various figures of the disclosure depict a portion of an electronic device, and some elements in the various figures may not be drawn to scale. Furthermore, the number and size of each device shown in the figures are illustrative only and are not intended to limit the scope of the disclosure.

Certain terms are used throughout the description and the following claims to refer to specific elements. As will be understood by those skilled in the art, electronic device manufacturers may refer to elements by different names. This specification does not intend to distinguish between elements that differ by name but not function. In the following description and in the claims, the terms "comprise," "include," and "have" are used in an open manner, and should therefore be interpreted to mean "include but not limited to . . . ". Therefore, when the terms "comprise", "include" and/or "have" are used in the description of the disclosure, it indicates existence of corresponding features, regions, steps, operations and/or elements, but is not limited to existence of one or more corresponding features, regions, steps, operations and/or elements.

It should be understood that when an element is referred to as being "coupled", "connected" or "conductive" to another element, the element may be directly connected to another element to directly establish an electrical connection, or there may be an intermediate element between these elements for relaying the electrical connection (indirect electrical connection). In contrast, when an element is referred to as being "directly coupled", "directly conductive" or "directly connected" to another element, there is no intermediate element there between.

Although terms such as "first", "second", "third", etc., may be used to describe various constituent elements, such constituent elements are not limited by these terms. The terms are only used to distinguish constituent elements in the specification from other constituent elements. The claims may not use the same terms, but may use the terms "first", "second", "third", etc., relative to a claimed order of the elements. Therefore, in the following description, the first constituent element may be the second constituent element in the claims.

An electronic device of the disclosure may include a display device, an antenna device, a sensing device, a light-emitting device, a touch display device, a curved display device, a free shape display device, a tiling device, or a package device, but the disclosure is not limited thereto. The electronic device may include a bendable or flexible electronic device. The electronic device may, for example, include liquid crystals, light-emitting diodes, quantum dots (QDs), fluorescence, phosphors, other suitable display media, or a combination thereof, but the disclosure is not limited thereto. The light-emitting diodes may, for example, include organic light emitting diodes (OLEDs), mini LEDs, micro LEDs, or quantum dot LEDs (which may include QLEDs, QDLEDs), or other suitable materials, or a combination thereof, but the disclosure is not limited thereto. The display device may include, for example, a tiled display device, a tiled backlight device, but the disclosure is not limited thereto. The antenna device may be, for example, a liquid crystal antenna, but the disclosure is not limited thereto. The antenna device may include, for example, an antenna tiling device, but the disclosure is not limited thereto. It should be noted that, the electronic device may be any arrangement and combination of the foregoing, but the disclosure is not limited thereto. In addition, a shape of the electronic device may be rectangular, circular, polygonal, a shape with curved edges, or other suitable shapes. The electronic device may have peripheral systems such as a driving system, a control system, a light source system, etc., to support the display device, the antenna device or the tiling device, but the disclosure is not limited thereto. The sensing device may include a camera, an infrared sensor or a fingerprint sensor, etc., but the disclosure is not limited thereto. In some embodiments, the sensing device may further include a flash lamp, an infrared (IR) light source, other sensors, electronic components, or a combination thereof, but the disclosure is not limited thereto.

In the disclosure, the embodiments use a "pixel" or "pixel unit" as a unit for describing a specific region containing at least one functional circuit for at least one specific function. The region of a "pixel" depends on the unit used to provide the specific function, and adjacent pixels may share same portions or wires, but may also include specific portions of themselves therein. For example, the adjacent pixels may share the same scan lines or the same data lines, but the pixels may also have their own transistors or capacitors.

It should be noted that the technical features in the different embodiments described below may be replaced, recombined or mixed with each other to constitute another embodiment without departing from the spirit of the disclosure.

Referring to FIG. 1, FIG. 1 is a schematic diagram of a tiling device according to a first embodiment of the disclosure. In the embodiment, a tiling device 100 includes a first substrate SB1, a second substrate SB2 and a data driving circuit 110. The first substrate SB1 includes first semiconductor units SU1_1-SU1_18. The second substrate SB2 includes second semiconductor units SU2_1-SU2_18. The first semiconductor units SU1_1-SU1_18 and the second semiconductor units SU2_1-SU2_18 are respectively pixel units or sub-pixel units. For example, the first semiconductor units SU1_1-SU1_18 are arranged in a plurality of rows and a plurality of columns. The second semiconductor units SU2_1-SU2_18 are arranged in a plurality of rows and a plurality of columns. In some embodiments, the first semiconductor units SU1_1-SU1_18 and the second semiconductor units SU2_1-SU2_18 include light-emitting diodes, photodiodes or antenna diodes, but the disclosure is not limited thereto.

In some embodiments, the first semiconductor units SU1_1-SU1_18 are arranged in a single column or a single row. The second semiconductor units SU2_1-SU2_18 are arranged in a single column or a single row.

Taking the embodiment as an example, the first semiconductor units SU1_1-SU1_6 are respectively a first unit row of the first substrate SB1. The first semiconductor units SU1_7-SU1_12 are respectively a second unit row of the first substrate SB1. The first semiconductor units SU1_13-SU1_18 are respectively a third unit row of the first substrate SB1. The first semiconductor units SU1_1, SU1_7, and SU1_13 are respectively a first unit column of the first substrate SB1. The first semiconductor units SU1_2, SU1_8, SU1_14 are respectively a second unit column of the first substrate SB1, and so on. Therefore, based on the configuration of the first semiconductor units SU1_1-SU1_18, the first substrate SB1 has first data channels CH1_1-CH1_6 for receiving first data signals SD1_1-SD1_6. The first data channel CH1_1 corresponds to the first unit column. The first data channel CH1_2 corresponds to the second unit column, and so on.

Similarly, the second semiconductor units SU2_1-SU2_6 are respectively a first unit row of the second substrate SB2. The second semiconductor units SU2_7-SU2_12 are respectively a second unit row of the second substrate SB2. The second semiconductor units SU2_13-SU2_18 are respectively a third unit row of the second substrate SB2. The second semiconductor units SU2_1, SU2_7, and SU2_13 are respectively a first unit column of the second substrate SB2. The second semiconductor units SU2_2, SU2_8, SU2_14 are respectively a second unit column of the second substrate SB2, and so on. Therefore, based on the above configuration of the second semiconductor units SU2_1-SU2_18, the second substrate SB2 has second data channels CH2_1-CH2_6 for receiving second data signals SD2_1-SD2_6. The second data channel CH2_1 corresponds to the first unit column. The second data channel CH2_2 corresponds to the second unit column, and so on.

For convenience of description, in the embodiment, the first semiconductor units SU1_1-SU1_18 of the first substrate SB1 and the second semiconductor units SU2_1-SU2_18 of the second substrate SB2 are taken as an example for description. However, the disclosure is not limited thereto. The number of substrates of the disclosure may be plural. The number of semiconductor units in the first substrate SB1 and the second substrate SB2 of the disclosure may be one or plural. The number and arrangement of the semiconductor units of the substrate of the disclosure may be adjusted according to actual usage requirements. A number of the first data channels CH1_1-CH1_6 in the embodiment is the same as that of the second data channels CH2_1-CH2_6. In some embodiments, the number of the first data channels of the first substrate SB1 is different from the number of the second data channels of the second substrate SB2.

In the embodiment, the data driving circuit 110 is coupled to the first substrate SB1 and the second substrate SB2. The data driving circuit 110 generates the first data signals SD1_1-SD1_6 and the second data signals SD2_1-SD2_6.

The data driving circuit 110 simultaneously provides the first data signals SD1_1-SD1_6 to the first substrate SB1 and the second substrate SB2, and simultaneously provides the second data signals SD2_1-SD2_6 to the first substrate SB1 and the second substrate SB2. In the embodiment, the data driving circuit 110 simultaneously provides the first data signals SD1_1-SD1_6 to the first semiconductor units SU1_1-SU1_18 and the second semiconductor units SU2_1-SU2_18, and simultaneously provides the second data signals SD2_1-SD2_6 to the first semiconductor units SU1_1-SU1_18 and the second semiconductor units SU2_1-SU2_18. Therefore, the number of data pins P1-P6 of the data driving circuit 110 is six.

It should be noted that the data driving circuit 110 simultaneously provides the first data signals SD1_1-SD1_6 to the first semiconductor units SU1_1-SU1_18 and the second semiconductor units SU2_1-SU2_18, and simultaneously provides the second data signals SD2_1-SD2_6 to the first semiconductor units SU1_1-SU1_18 and the second semiconductor units SU2_1-SU2_18. Therefore, the number of the data pins P1-P6 of the data driving circuit 110 may be equal to the number (i.e., 6) of the data channels of one of the first substrate SB1 and the second substrate SB2, and not equal to a sum of the number of the first data channels CH1_1-CH1_6 of the first substrate SB1 and the number of the second data channels CH2_1-CH2_6 of the second substrate SB2. In this way, the number of the data pins of the data driving circuit 110 is reduced. Even if the number of substrates is increased, the number of data pins of the data driving circuit 110 does not need to be increased.

Further, in a first time period, the data driving circuit 110 generates the first data signals SD1_1-SD1_6. The data driving circuit 110 provides the first data signal SD1_1 to the first data channel CH1_1 and the second data channel CH2_1 through the data pin P1. The data driving circuit 110 provides the first data signal SD1_2 to the first data channel CH1_2 and the second data channel CH2_2 through the data pin P2, and so on. During a second time period, the data driving circuit 110 generates the second data signals SD2_1-SD2_6. The data driving circuit 110 provides the first data signal SD2_1 to the first data channel CH1_1 and the second data channel CH2_1 through the data pin P1. The data driving circuit 110 provides the second data signal SD2_2 to the first data channel CH1_2 and the second data channel CH2_2 through the data pin P2, and so on.

In the embodiment, the first substrate SB1 and the second substrate SB2 are respectively tiling substrates. For example, the first substrate SB1 and the second substrate SB2 may be a tiled display panel and a tiled backlight panel, respectively, but the disclosure is not limited thereto. In this way, a display or light-emitting region of the tiling device 100 may be expanded. In some embodiments, the first substrate SB1 and the second substrate SB2 include light-emitting diode and thin-film transistor arrays, but the disclosure is not limited thereto.

In the embodiment, the tiling device 100 further includes a scan driving circuit 120. The scan driving circuit 120 provides a first scan driving signal SS1, a second scan driving signal SS2, a third scan driving signal SS3, a fourth scan driving signal SS4, a fifth scan driving signal SS5 and a sixth scan driving signal SS6 in different time periods. The scan driving circuit 120 is coupled to the first substrate SB1 and the second substrate SB2. The scan driving circuit 120 provides the first scan driving signal SS1 to the first substrate SB1 in the first time period, and provides the second scan driving signal SS2 to the second substrate SB2 in the second time period. For example, in the first time period, the first semiconductor units SU1_1-SU1_6 are selected in response to the first scan driving signal SS1. Therefore, the first semiconductor units SU1_1-SU1_6 update display contents in response to the first data signals SD1_1-SD1_6. During the second time period, the second semiconductor units SU2_1-SU2_6 are selected in response to the second scan driving signal SS2. Therefore, the second semiconductor units SU2_1-SU2_6 update display contents in response to the second data signals SD2_1-SD2_6, and so on. In the embodiment, the scan driving circuit 120 may be implemented by a shift register or a gate driving circuit. In some embodiments, the scan driving circuit 120 may also be disposed on the first substrate SB1 and the second substrate SB2, but the disclosure is not limited thereto.

Figure 2:
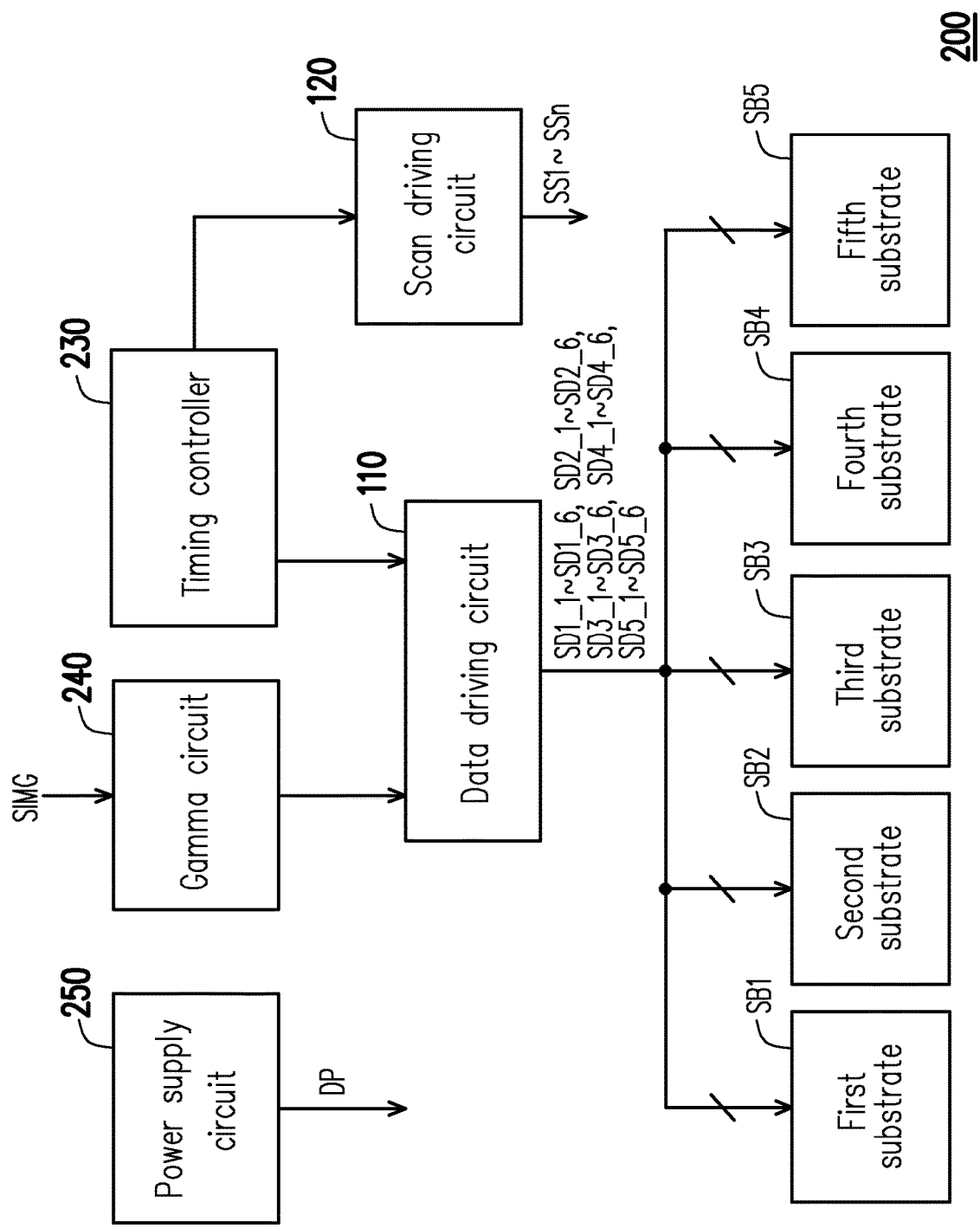
FIG. 2 is a schematic diagram of a tiling device according to a second embodiment of the disclosure.

Referring to FIG. 2, FIG. 2 is a schematic diagram of a tiling device according to a second embodiment of the disclosure. In the embodiment, a tiling device 200 includes a first substrate SB1, a second substrate SB2, a third substrate SB3, a fourth substrate SB4, a fifth substrate SB5, a data driving circuit 110 and a scan driving circuit 120. The data driving circuit 110 is coupled to the first substrate SB1, the second substrate SB2, the third substrate SB3, the fourth substrate SB4 and the fifth substrate SB5. In the embodiment, configurations of the third substrate SB3, the fourth substrate SB4 and the fifth substrate SB5 are substantially similar to the configurations of the first substrate SB1 and the second substrate SB2, and therefore details thereof are not repeated here.

In the embodiment, the data driving circuit 110 generates first data signals SD1_1-SD1_6, second data signals SD2_1-SD2_6, third data signals SD3_1-SD3_6, fourth data signals SD4_1-SD4_6, and fifth data signals SD5_1-SD5_6 in different time periods. For example, the data driving circuit 110 generates the first data signals SD1_1-SD1_6 in the first time period, and generates the second data signals SD2_1-SD2_6 in the second time period, and so on.

In the embodiment, the data driving circuit 110 simultaneously provides the first data signals SD1_1-SD1_6 to first semiconductor units of the first substrate SB1, second semiconductor units of the second substrate SB2, and third semiconductor units of the third substrate SB3, fourth semiconductor units of the fourth substrate SB4, and fifth semiconductor units of the fifth substrate SB5. The data driving circuit 110 simultaneously provides the second data signals SD2_1-SD2_6 to the first semiconductor units of the first substrate SB1, the second semiconductor units of the second substrate SB2, the third semiconductor units of the third substrate SB3, the fourth semiconductor units of the fourth substrate SB4, and the fifth semiconductor units of the fifth substrate SB5. The data driving circuit 110 simultaneously provides the third data signals SD3_1-SD3_6 to the first semiconductor units of the first substrate SB1, the second semiconductor units of the second substrate SB2, the third semiconductor units of the third substrate SB3, the fourth semiconductor units of the fourth substrate SB4, and the fifth semiconductor units of the fifth substrate SB5. The data driving circuit 110 simultaneously provides the fourth data signals SD4_1-SD4_6 to the first semiconductor units of the first substrate SB1, the second semiconductor units of the second substrate SB2, the third semiconductor units of the third substrate SB3, the fourth semiconductor units of the fourth substrate SB4, and the fifth semiconductor units of the fifth substrate SB5. The data driving circuit 110 simultaneously provides the fifth data signals SD5_1-SD5_6 to the first semiconductor units of the first substrate SB1, the second semiconductor units of the second substrate SB2, the third semiconductor units of the third substrate SB3, the fourth semiconductor units of the fourth substrate SB4, and the fifth semiconductor units of the fifth substrate SB5.

In the embodiment, the scan driving circuit 120 is coupled to the first substrate SB1, the second substrate SB2, the third substrate SB3, the fourth substrate SB4 and the fifth substrate SB5. The scan driving circuit 120 provides the first scan driving signal SS1 to an nth scan signal SSn in different time periods. The scan driving circuit 120 provides the first scan driving signal SS1 to the first substrate SB1 in the first time period, provides the second scan driving signal SS2 to the second substrate SB2 in the second time period, and provides the third scan driving signal SS3 to the third substrate SB3 in the third time period, and so on. In some embodiments, the scan driving circuit 120 may also be disposed on the first substrate SB1, the second substrate SB2, the third substrate SB3, the fourth substrate SB4, and the fifth substrate SB5, but the disclosure is not limited thereto. In some embodiments, the first substrate SB1, the second substrate SB2, the third substrate SB3, the fourth substrate SB4, and the fifth substrate SB5 include light-emitting diode and thin-film transistor arrays, but the disclosure is not limited thereto.

In the embodiment, the tiling device 200 further includes a timing controller 230, a gamma circuit 240 and a power supply circuit 250. The timing controller 230 is coupled to the data driving circuit 110 and the scan driving circuit 120. The timing controller 230 provides a clock signal required by the data driving circuit 110 during operation, and provides a clock signals and an initial signal required by the scan driving circuit 120 during operation. The gamma circuit 240 is coupled to the data driving circuit 110. Based on a gamma curve, the gamma circuit 240 performs digital-to-analog conversion on an image signal SIMG to generate voltage signals for generating the first data signals SD1_1-SD1_6, the second data signals SD2_1-SD2_6, the third data signals SD3_1-SD3_6, the fourth data signals SD4_1-SD4_6 and the fifth data signals SD5_1-SD5_6. In the embodiment, the gamma circuit 240 may be a digital-to-analog converter. The power supply circuit 250 provides a driving power DP required by the tiling device 200 during operation.

Figure 3:
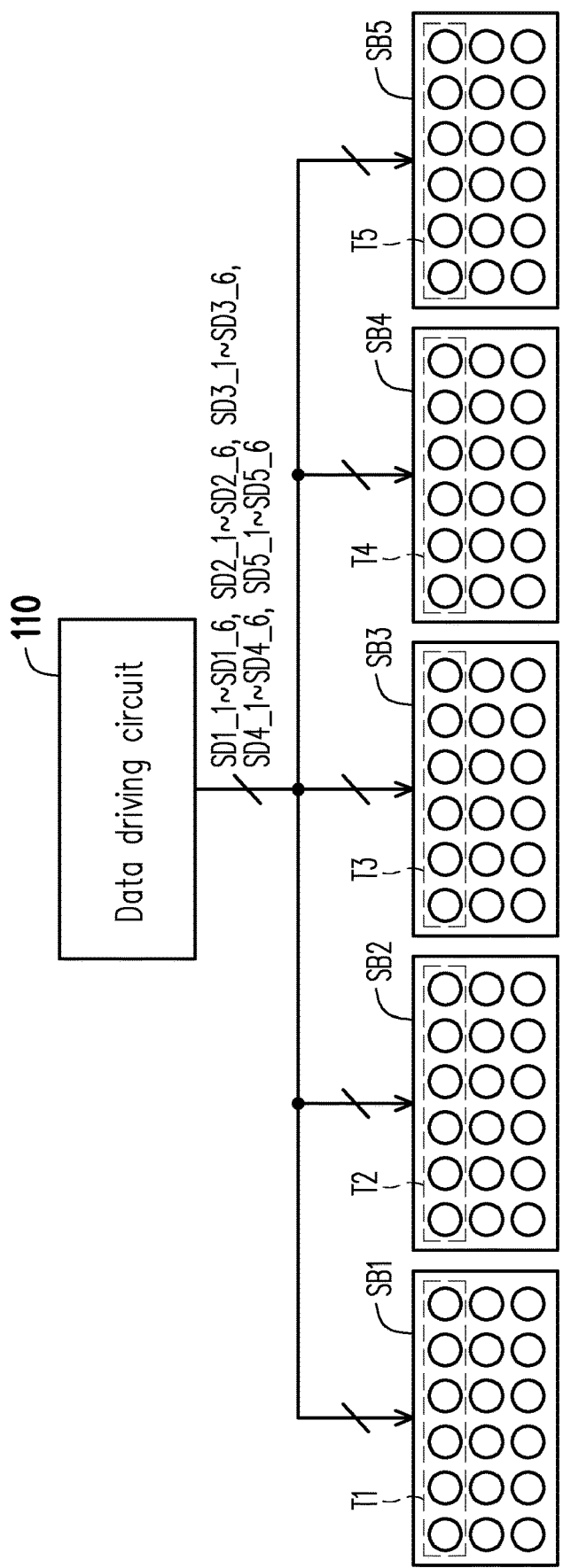
FIG. 3 is an operational schematic diagram drawn according to the second embodiment.

Referring to FIG. 2 and FIG. 3 at the same time, FIG. 3 is an operational schematic diagram drawn according to the second embodiment. In the embodiment, the first semiconductor units of the first substrate SB1, the second semiconductor units of the second substrate SB2, the third semiconductor units of the third substrate SB3, the fourth semiconductor units of the fourth substrate SB4, and the fifth semiconductor units of the fifth substrate SB5, for example, have the same arrangement. Therefore, the number of the first data channels of the first substrate SB1, the number of the second data channels of the second substrate SB2, the number of the third data channels of the third substrate SB3, the number of the fourth data channels of the fourth substrate SB4, and the number of the fifth data channels of the fifth substrate SB5 are identical to one another.

Taking updating of the display content of the first unit row as an example, in a first time period T1, the data driving circuit 110 provides the first data signals SD1_1-SD1_6 to the first to fifth substrates SB1-SB5. The scan driving circuit 120 provides the first scan driving signal SS1 to the first substrate SB1. The first unit row of the first substrate SB1 is selected in response to the first scan driving signal SS1. Therefore, the display content of the first unit row of the first substrate SB1 is updated in response to the first data signals SD1_1-SD1_6. In a second time period T2, the data driving circuit 110 provides the second data signals SD2_1-SD2_6 to the first to fifth substrates SB1-SB5. The scan driving circuit 120 provides the second scan driving signal SS2 to the second substrate SB2. The first unit row of the second substrate SB2 is selected in response to the second scan driving signal SS2. Therefore, the display content of the first unit row of the second substrate SB2 is updated in response to the second data signals SD2_1-SD2_6. In a third time period T3, the data driving circuit 110 provides the third data signals SD3_1-SD3_6 to the first to fifth substrates SB1-SB5. The scan driving circuit 120 provides the third scan driving signal SS3 to the third substrate SB3. The first unit row of the third substrate SB3 is selected in response to the third scan driving signal SS3. Therefore, the display content of the first unit row of the third substrate SB3 is updated in response to the third data signals SD3_1-SD3_6. In a fourth time period T4, the data driving circuit 110 provides the fourth data signals SD4_1-SD4_6 to the first to fifth substrates SB1-SB5. The first unit row of the fourth substrate SB4 is selected in response to the fourth scan driving signal SS4. Therefore, the display content of the first unit row of the fourth substrate SB4 is updated in response to the fourth data signals SD4_1-SD4_6. In a fifth time period T5, the data driving circuit 110 provides the fifth data signals SD5_1-SD5_6 to the first to fifth substrates SB1-SB5. The first unit row of the fifth substrate SB5 is selected in response to the fifth scan driving signal SS5. Therefore, the display content of the first unit row of the fifth substrate SB5 is updated in response to the fifth data signals SD5_1-SD5_6.

Based on the above description, the tiling device 200 uses 6 channels and 5 sets of scan signals to update the display contents of the first unit rows of the first substrate SB1 to the fifth substrate SB5.

In the embodiment, an order of the first time period T1 to the fifth time period T5 may be changed. In some embodiments, the scan driving circuit 120 may be coupled to the first substrate SB1, the second substrate SB2, the third substrate SB3, the fourth substrate SB4 and the fifth substrate SB5. The scan driving circuit 120 may also be disposed on the first substrate SB1, the second substrate SB2, the third substrate SB3, the fourth substrate SB4, and the fifth substrate SB5, but the disclosure is not limited thereto. In some embodiments, the first substrate SB1, the second substrate SB2, the third substrate SB3, the fourth substrate SB4, and the fifth substrate SB5 include light-emitting diode and thin-film transistor arrays, but the disclosure is not limited thereto.

Figure 4:
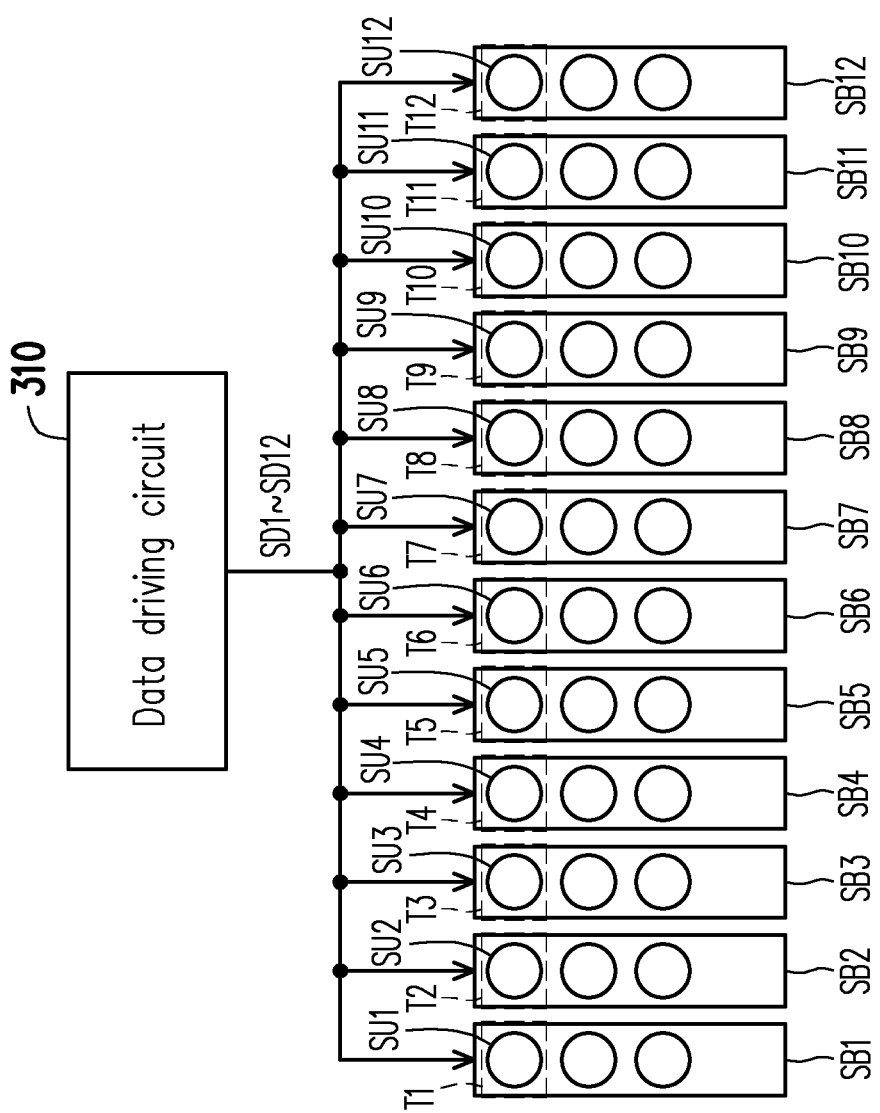
FIG. 4 is an operational schematic diagram of a tiling device according to a third embodiment of the disclosure.

Referring to FIG. 4, FIG. 4 is an operational schematic diagram of a tiling device according to a third embodiment of the disclosure. In the embodiment, a tiling device 300 includes a first substrate SB1 to a twelfth substrate SB12 and a data driving circuit 310. The first to twelfth substrates SB1-SB12 each have a single unit row. Therefore, the data driving circuit 310 has a single data pin. The first to twelfth substrates SB1-SB12 respectively have a single data channel.

Taking updating of the display content of the first unit row as an example, in the first time period T1, the data driving circuit 310 provides the first data signal SD1 to the first to twelfth substrates SB1-SB12. The first semiconductor unit SU1 of the first substrate SB1 is selected in response to the first scan signal. Therefore, the first semiconductor unit SU1 updates the display content in response to the first data signal SD1. In the second time period T2, the data driving circuit 310 provides the second data signal SD2 to the first to twelfth substrates SB1-SB12. The second semiconductor unit SU2 of the second substrate SB2 is selected in response to the second scan signal. Therefore, the second semiconductor unit SU2 updates the display content in response to the second data signal SD2. Similarly, it can be inferred that the data driving circuit 310 respectively generates the third data signal SD3 to a twelfth data signal SD12 in the third time period T3 to a twelfth time period T12. The third to twelfth semiconductor units SU3-SU12 of the first unit rows of the third to twelfth substrates SB3-SB12 are respectively selected in response to the corresponding scan signals in the corresponding time periods to update the display contents.

Based on the above description, the tiling device 300 uses one channel and 12 sets of scan signals to update the display contents of the first unit rows of the first substrate SB1 to the fifth substrate SB5. In some embodiments, the scan driving circuit may be coupled to the first to twelfth substrates SB1-SB12. The scan driving circuit 120 may also be disposed on the first to twelfth substrates SB1-SB12, but the disclosure is not limited thereto. In some embodiments, the first to twelfth substrates SB1-SB12 include light-emitting diode and thin-film transistor arrays, but the disclosure is not limited thereto.

Figure 5:
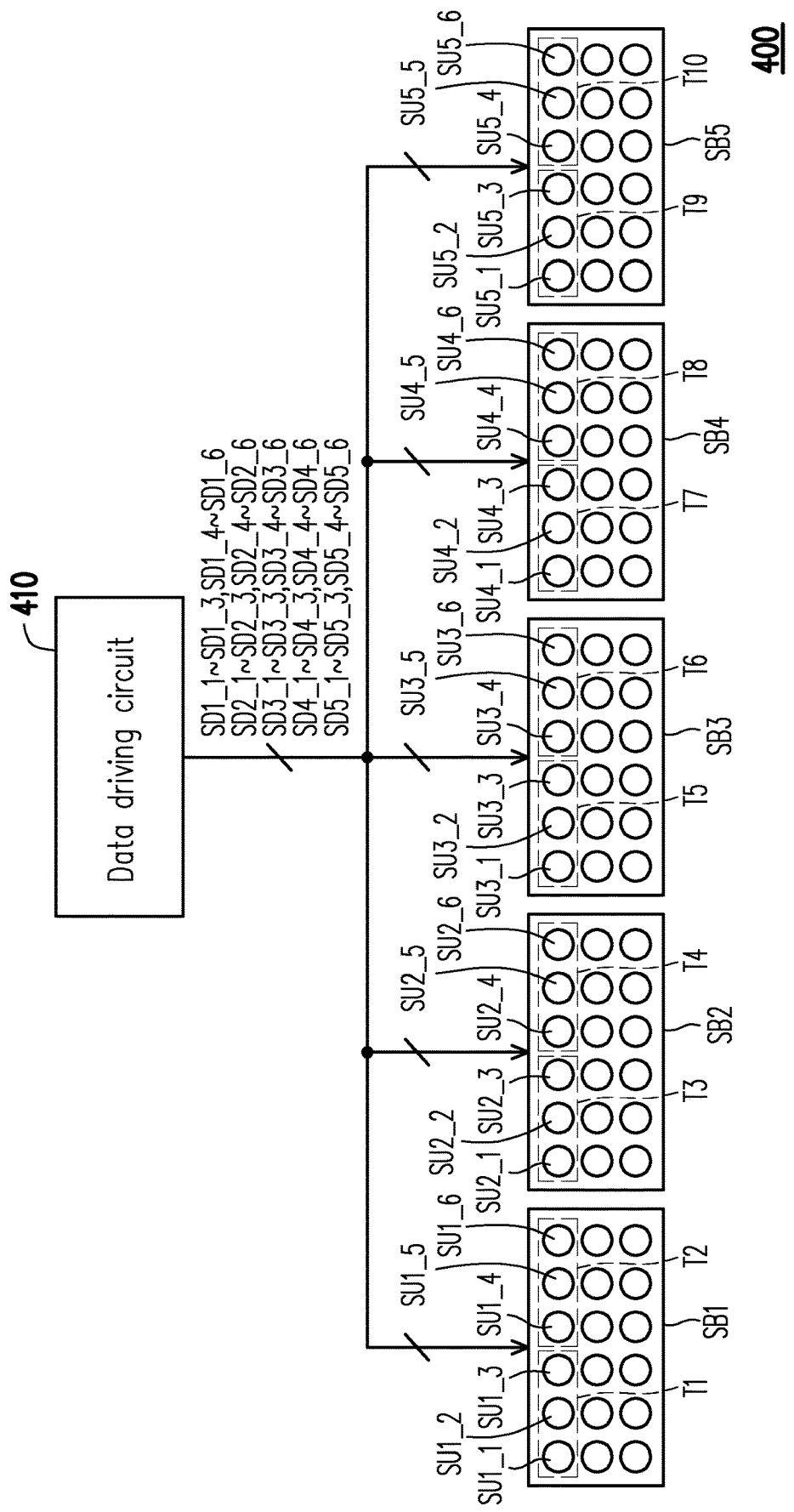
FIG. 5 is an operational schematic diagram of a tiling device according to a fourth embodiment of the disclosure.

Referring to FIG. 5, FIG. 5 is an operational schematic diagram of a tiling device according to a fourth embodiment of the disclosure. In the embodiment, a tiling device 400 includes a first substrate SB1 to a fifth substrate SB5 and a data driving circuit 410. The first to fifth substrates SB1-SB5 each have six unit columns. The data driving circuit 410 has 3 data pins. Configurations of the first substrate SB1 to the fifth substrate SB5 are similar to the configuration of the first substrate SB1 shown in FIG. 1, so that details thereof are not repeated here.

Taking updating of the display content of the first unit row as an example, in the first time period T1, the data driving circuit 410 provides the first data signals SD1_1-SD1_3 to the first to fifth substrates SB1-SB5. The first semiconductor units SU1_1-SU1_3 in the first unit row of the first substrate SB1 are selected. Therefore, the first semiconductor units SU1_1-SU1_3 update the display contents in response to the first data signals SD1_1-SD1_3. In the second time period T2, the data driving circuit 410 provides the first data signals SD1_4-SD1_6 to the first to fifth substrates SB1-SB5. The first semiconductor units SU1_4 to SU1_6 in the first unit row of the first substrate SB1 are selected. Therefore, the first semiconductor units SU1_4-SU1_6 update the display contents in response to the first data signals SD1_4-SD1_6.

In the third time period T3, the data driving circuit 410 provides the second data signals SD2_1-SD2_3 to the first to fifth substrates SB1-SB5. The second semiconductor units SU2_1-SU2_3 in the first unit row of the second substrate SB2 are selected. Therefore, the second semiconductor units SU2_1-SU2_3 update the display contents in response to the second data signals SD2_1-SD2_3. In the fourth time period T4, the data driving circuit 410 provides the second data signals SD2_4-SD2_6 to the first to fifth substrates SB1-SB5. The second semiconductor units SU2_4-SU2_6 in the first unit row of the second substrate SB2 are selected. Therefore, the second semiconductor units SU2_4-SU2_6 update the display contents in response to the second data signals SD2_4-SD2_6.

In the fifth time period T5, the data driving circuit 410 provides the third data signals SD3_1-SD3_3 to the first to fifth substrates SB1-SB5. The third semiconductor units SU3_1-SU3_3 in the first unit row of the third substrate SB3 are selected. Therefore, the third semiconductor units SU3_1-SU3_3 update the display contents in response to the third data signals SD3_1-SD3_3. In a sixth time period T6, the data driving circuit 410 provides the third data signals SD3_4-SD3_6 to the first to fifth substrates SB1-SB5. The third semiconductor units SU3_4-SU3_6 in the first unit row of the third substrate SB3 are selected. Therefore, the third semiconductor units SU3_4-SU3_6 update the display contents in response to the third data signals SD3_4-SD3_6.

In a seventh time period T7, the data driving circuit 410 provides the fourth data signals SD4_1-SD4_3 to the first to fifth substrates SB1-SB5. The fourth semiconductor units SU4_1-SU4_3 in the first unit row of the fourth substrate SB4 are selected. Therefore, the fourth semiconductor units SU4_1-SU4_3 update the display contents in response to the fourth data signals SD4_1-SD4_3. In an eighth time period T8, the data driving circuit 410 provides the fourth data signals SD4_4-SD4_6 to the first to fifth substrates SB1-SB5. The fourth semiconductor units SU4_4-SU4_6 in the first unit row of the fourth substrate SB4 are selected. Therefore, the fourth semiconductor units SU4_4-SU4_6 update the display contents in response to the fourth data signals SD4_4-SD4_6.

In a ninth time period T9, the data driving circuit 410 provides the fifth data signals SD5_1-SD5_3 to the first to fifth substrates SB1-SB5. The fifth semiconductor units SU5_1-SU5_3 in the first unit row of the fifth substrate SB5 are selected. Therefore, the fifth semiconductor units SU5_1-SU5_3 update the display contents in response to the fifth data signals SD5_1-SD5_3. In a tenth time period T10, the data driving circuit 410 provides the fifth data signals SD5_4-SD5_6 to the first to fifth substrates SB1-SB5. The fifth semiconductor units SU5_4-SU5_6 in the first unit row of the fifth substrate SB5 are selected. Therefore, the fifth semiconductor units SU5_4-SU5_6 update the display contents in response to the fifth data signals SD5_4-SD5_6.

Based on the above description, the tiling device 400 uses 3 channels and 10 sets of scan signals to update the display contents of the first unit rows of the first substrate SB1 to the fifth substrate SB5.

In some embodiments, in the first time period T1, the first semiconductor units SU1_1, SU1_3, SU1_5 may be selected. In the second time period T2, the first semiconductor units SU1_2, SU1_4, SU1_6 may be selected. The disclosure is not limited to the selection order of the embodiment. In some embodiments, the scan driving circuit may be coupled to the first substrate SB1, the second substrate SB2, the third substrate SB3, the fourth substrate SB4, and the fifth substrate SB5. The scan driving circuit 120 may also be disposed on the first substrate SB1, the second substrate SB2, the third substrate SB3, the fourth substrate SB4, and the fifth substrate SB5, but the disclosure is not limited thereto. In some embodiments, the first substrate SB1, the second substrate SB2, the third substrate SB3, the fourth substrate SB4, and the fifth substrate SB5 include light-emitting diode and thin-film transistor arrays, but the disclosure is not limited thereto.

Figure 6:
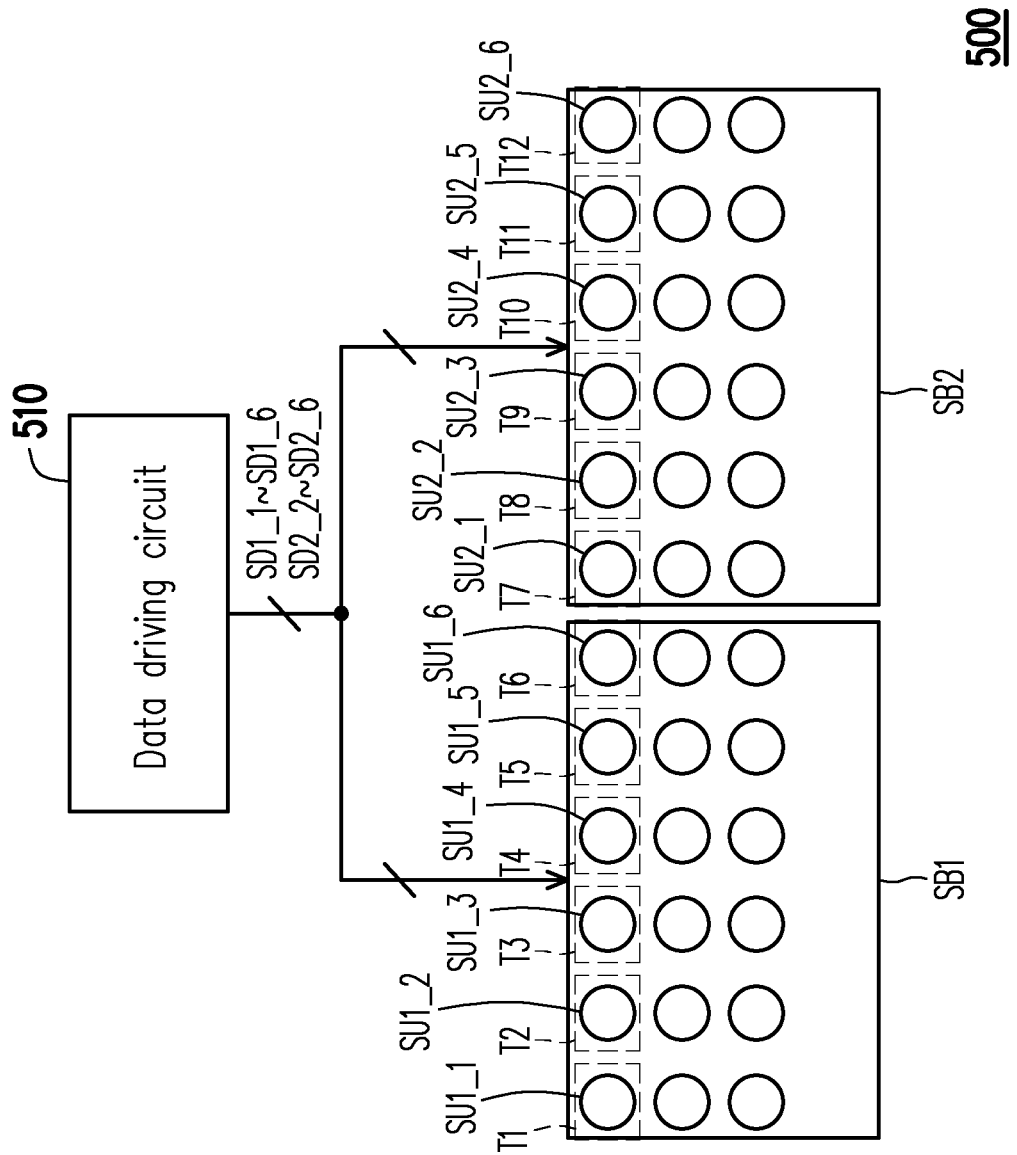
FIG. 6 is an operational schematic diagram of a tiling device according to a fifth embodiment of the disclosure.

Referring to FIG. 6, FIG. 6 is an operational schematic diagram of a tiling device according to a fifth embodiment of the disclosure. In the embodiment, a tiling device 500 includes a first substrate SB1, a second substrate SB2 and a data driving circuit 510. In the embodiment, the configurations of the first substrate SB1 and the second substrate SB2 are similar to the configurations of the first substrate SB1 and the second substrate SB2 shown in FIG. 1, and therefore details thereof are not repeated. The data driving circuit 510 has a single data pin. The first substrate SB1 and the second substrate SB2 each have six data channels.

Taking updating of the display content of the first unit row as an example, in the first time period T1, the data driving circuit 310 provides the first data signal SD1_1 to the first substrate SB1 and the second substrate SB2. The first semiconductor unit SU1_1 of the first substrate SB1 is selected. Therefore, the first semiconductor unit SU1_1 updates the display content in response to the first data signal SD1_1. In the second time period T2, the data driving circuit 310 provides the first data signal SD1_2 to the first substrate SB1 and the second substrate SB2. The first semiconductor unit SU1_2 of the first substrate SB1 is selected. Therefore, the first semiconductor unit SU1_2 updates the display content in response to the first data signal SD1_2, and so on. In the seventh time period T7, the data driving circuit 310 provides the second data signal SD2_1 to the first substrate SB1 and the second substrate SB2. The second semiconductor unit SU2_1 of the second substrate SB2 is selected. Therefore, the second semiconductor unit SU2_1 updates the display content in response to the second data signal SD2_1. In the eighth time period T8, the data driving circuit 310 provides the second data signal SD2_2 to the first substrate SB1 and the second substrate SB2. The second semiconductor unit SU2_2 of the second substrate SB2 is selected. Therefore, the second semiconductor unit SU2_2 updates the display content in response to the second data signal SD2_2, and so on.

Based on the above, the tiling device 500 uses one channel and 12 sets of scan signals to update the display contents of the first unit rows of the first substrate SB1 and the second substrate SB2. In some embodiments, the scan driving circuit may be coupled to the first substrate SB1 and the second substrate SB2. The scan driving circuit may also be disposed on the first substrate SB1 and the second substrate SB2, but the disclosure is not limited thereto. In some embodiments, the first substrate SB1 and the second substrate SB2 include light-emitting diode and thin-film transistor arrays, but the disclosure is not limited thereto.

Figure 7:
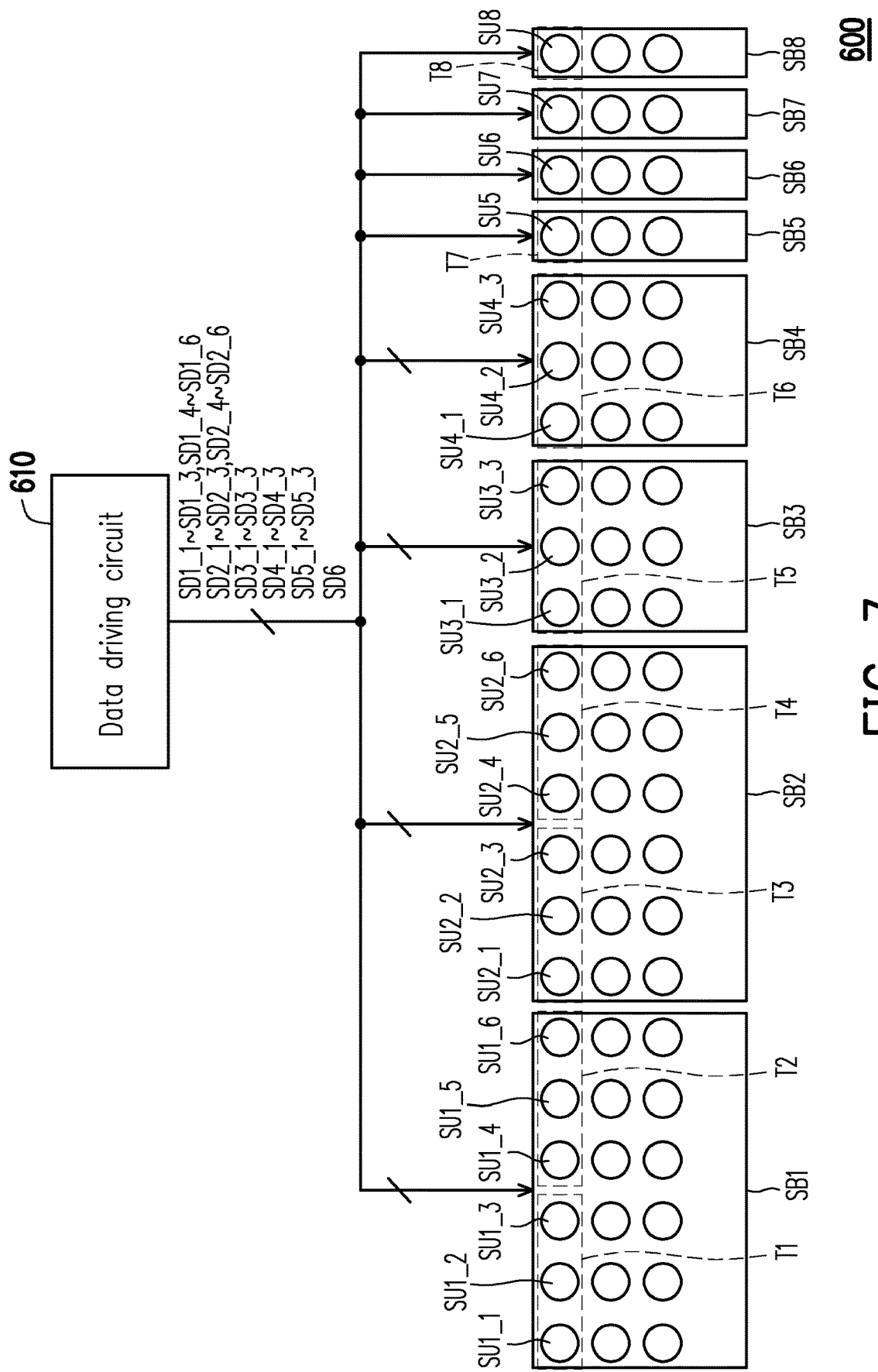
FIG. 7 is an operational schematic diagram of a tiling device according to a sixth embodiment of the disclosure.

Referring to FIG. 7, FIG. 7 is an operational schematic diagram of a tiling device according to a sixth embodiment of the disclosure. In the embodiment, a tiling device 600 includes a first substrate SB1 to an eighth substrate SB8 and a data driving circuit 610. The numbers of data channels of the first to eighth substrates SB1-SB8 are not completely the same. Taking the embodiment as an example, the numbers of the data channels of the first substrate SB1 to the fourth substrate SB4 are respectively three. The numbers of the data channels of the fifth substrate SB5 to the eighth substrate SB8 are respectively one. The data driving circuit 610 has 3 data pins. A display region of the tiling device 600 may be expanded by substrates with the same or different numbers. In addition, the data pins of the data driving circuit 610 do not need to be increased. The disclosure is not limited to the numbers of data channels of the first substrate SB1 to the eighth substrate SB8.

Taking updating of the display content of the first unit row as an example, in the first time period T1, the data driving circuit 310 provides the first data signals SD1_1-SD1_3 to the first to eighth substrates SB1-SB8. The first semiconductor units SU1_1-SU1_3 in the first unit row of the first substrate SB1 are selected. Therefore, the first semiconductor units SU1_1-SU1_3 update the display contents in response to the first data signals SD1_1-SD1_3. In the second period T2, the data driving circuit 610 provides the first data signals SD1_4-SD1_6 to the first to eighth substrates SB1-SB8. The first semiconductor units SU1_4-SU1_6 in the first unit row of the first substrate SB1 are selected. Therefore, the first semiconductor units SU1_4-SU1_6 update the display contents in response to the first data signals SD1_4-SD1_6.

In the third time period T3, the data driving circuit 610 provides the second data signals SD2_1-SD2_3 to the first to eighth substrates SB1-SB8. The second semiconductor units SU2_1-SU2_3 in the first unit row of the second substrate SB2 are selected. Therefore, the second semiconductor units SU2_1-SU2_3 update the display contents in response to the second data signals SD2_1-SD2_3. In the fourth time period T4, the data driving circuit 610 provides the second data signals SD2_4-SD2_6 to the first to eighth substrates SB1-SB8. The second semiconductor units SU2_4-SU2_6 in the first unit row of the second substrate SB2 are selected. Therefore, the second semiconductor units SU2_4-SU2_6 update the display contents in response to the second data signals SD2_4-SD2_6.

In the fifth time period T5, the data driving circuit 610 provides the third data signals SD3_1-SD3_3 to the first to eighth substrates SB1-SB8. The third semiconductor units SU3_1-SU3_3 of the third substrate SB3 are selected. Therefore, the third semiconductor units SU3_1-SU3_3 update the display contents in response to the third data signals SD3_1-SD3_3. In the sixth time period T6, the data driving circuit 610 provides the fourth data signals SD4_1-SD4_3 to the first to eighth substrates SB1-SB8. The fourth semiconductor units SU4_1-SU4_3 of the fourth substrate SB4 are selected. Therefore, the fourth semiconductor units SU4_1-SU4_3 update the display contents in response to the fourth data signals SD4_1-SD4_3.

In the seventh period T7, the data driving circuit 410 provides the fifth data signals SD5_1-SD5_3 to the first to eighth substrates SB1-SB8. The fifth semiconductor unit SU5 of the fifth substrate SB5, the sixth semiconductor unit SU6 of the sixth substrate SB6, and the seventh semiconductor unit SU7 of the seventh substrate SB7 are selected. Therefore, the fifth semiconductor unit SU5 updates the display content in response to the fifth data signal SD5_1. The sixth semiconductor unit SU6 updates the display content in response to the fifth data signal SD5_2. The seventh semiconductor unit SU7 updates the display content in response to the fifth data signal SD5_3.

In the eighth time period T8, the data driving circuit 410 provides the sixth data signal SD6 to the first to eighth substrates SB1-SB8. The eighth semiconductor unit SU8 of the eighth substrate SB8 is selected. Therefore, the eighth semiconductor unit SU8 updates the display content in response to the sixth data signal SD6. In some embodiments, the scan driving circuit may be coupled to the first to eighth substrates SB1-SB8. The scan driving circuit may also be disposed on the first substrate SB1 to the eighth substrate SB8, but the disclosure is not limited thereto. In some embodiments, the first substrate SB1 to the eighth substrate SB8 include light-emitting diode and thin-film transistor arrays, but the disclosure is not limited thereto.

In summary, the data driving circuit simultaneously provides the first data signals to the plurality of first semiconductor units and the plurality of second semiconductor units, and simultaneously provides the second data signals to the plurality of first semiconductor units and the plurality of second semiconductor units. Therefore, the number of data pins of the data driving circuit may be equal to a number of data channels of one of the first substrate and the second substrate, not equal to a sum of the number of data channels of the first substrate and the number of data channels of the second substrate. In this way, the number of data pins of the data driving circuit may be reduced, and the tiling device with a smaller number of data pins is achieved. In addition, the display region of the tiling device may also be expanded by substrates with the same or different numbers. The data pins of the data driving circuit do not need to be added.

It will be apparent to those skilled in the art that various modifications and variations can be made to the disclosed embodiments without departing from the scope or spirit of the disclosure. In view of the foregoing, it is intended that the disclosure covers modifications and variations provided they fall within the scope of the following claims and their equivalents.

What is claimed is:

1. A tiling device, comprising:
a first substrate, comprising a plurality of first semiconductor units;
a second substrate, comprising a plurality of second semiconductor units; and
a data driving circuit, coupled to the first substrate and the second substrate, and configured to simultaneously provide first data signals to the plurality of first semiconductor units and the plurality of second semiconductor units, and simultaneously provide second data signals to the plurality of first semiconductor units and the plurality of second semiconductor units,
wherein the first substrate further comprises at least one first data channel for receiving the first data signals,
wherein the second substrate further comprises at least one second data channel for receiving the second data signals,
wherein the data driving circuit comprises at least one data pin for providing the first data signals and the second data signals, and
wherein a number of the at least one data pin is less than a sum of a number of the at least one first data channel and a number of the at least one second data channel.

2. The tiling device as claimed in claim 1, wherein the plurality of first semiconductor units and the plurality of second semiconductor units are each one of pixel units and sub-pixel units.

3. The tiling device as claimed in claim 1, wherein the data driving circuit provides the first data signals and the second data signals at different time periods.

4. The tiling device as claimed in claim 1, wherein the number of the at least one first data channels is the same as the number of the at least one second data channels.

5. The tiling device as claimed in claim 1, wherein the number of the at least one first data channel is different from the number of the at least one second data channel.

6. The tiling device as claimed in claim 1, further comprising:
a scan driving circuit, coupled to the first substrate and the second substrate, configured to provide a first scan signal to the first substrate during a first time period and provide a second scan signal to the second substrate during a second time period, wherein the first time period is different from the second time period.

7. The tiling device as claimed in claim 6, wherein the first data signal is provided to the plurality of first semiconductor units and the plurality of second semiconductor units during the first time period, and the second data signals are provided to the plurality of first semiconductor units and the plurality of second semiconductor units during the second time period.

8. The tiling device as claimed in claim 7, wherein during the first time period, the first scan signal is provided to at least one first semiconductor unit in a first unit row in the first substrate.

9. The tiling device as claimed in claim 8, wherein the at least one first semiconductor unit in the first unit row updates display content of the first unit row in response to at least one of the first data signals during the first time period.

10. The tiling device as claimed in claim 7, wherein during the second time period, the second scan signal is provided to at least one second semiconductor unit in a second unit row in the second substrate.

11. The tiling device as claimed in claim 10, wherein the at least one second semiconductor unit in the second unit row updates display content of the second unit row in response to at least one of the second data signals during the second time period.

12. The tiling device as claimed in claim 6, further comprising:
a third substrate, wherein the data driving circuit is coupled to the first substrate, the second substrate, and the third substrate.

13. The tiling device as claimed in claim 12, wherein the data driving circuit simultaneously provides the first data signals to the plurality of first semiconductor units, the plurality of second semiconductor units, and the plurality of third semiconductor units of the third substrate, and simultaneously provides the second data signals to the plurality of first semiconductor units, the plurality of second semiconductor units, and the plurality of third semiconductor units, and simultaneously provides third data signals to the plurality of first semiconductor units, the plurality of second semiconductor units, and the plurality of third semiconductor units.

14. The tiling device as claimed in claim 13, wherein
the third substrate further comprises at least one third data channel for receiving the third data signals, and
the number of the at least one first data channel, the number of the at least one second data channel, and a number of the at least one third data channel are identical to one another.

15. The tiling device as claimed in claim 13, wherein
the third substrate further comprises at least one third data channel for receiving the third data signals, and
the number of the at least one first data channel, the number of the at least one second data channel, and a number of the at least one third data channel are completely different from one another.

16. The tiling device as claimed in claim 12, wherein the scan driving circuit further provides third scan signals to the third substrate during a third time period, wherein the third time period is different from the first time period and the second time period.

17. The tiling device as claimed in claim 6, further comprising:
a timing controller, coupled to the data driving circuit and the scan driving circuit and configured to provide a clock signal required by the data driving circuit during operation and to provide a clock signal and an initial signal required by the scan driving circuit during operation.

18. The tiling device as claimed in claim 1, further comprising:
a gamma circuit, coupled to the data driving circuit and configured to perform digital-to-analog conversion on an image signal based on a gamma curve to generate voltage signals for generating the first data signals and the second data signals.

19. The tiling device as claimed in claim 1, wherein the first substrate and the second substrate are tiling substrates, respectively.

\* \* \* \* \*